United States Patent
Curtis et al.

(10) Patent No.: US 7,117,929 B2
(45) Date of Patent: Oct. 10, 2006

(54) HEAT SINK

(75) Inventors: Robert Curtis, Allen, TX (US); Brent A. Boudreaux, Highland Village, TX (US); Christian L. Belady, McKinney, TX (US); Eric C. Peterson, McKinney, TX (US); Shaun L. Harris, McKinney, TX (US)

(73) Assignee: Hewlett-Packard Development Company, LP., Houston, TX (US)

( * ) Notice: Subject to any disclaimer, the term of this patent is extended or adjusted under 35 U.S.C. 154(b) by 133 days.

(21) Appl. No.: 10/976,033

(22) Filed: Oct. 27, 2004

(65) Prior Publication Data
US 2006/0086481 A1 Apr. 27, 2006

(51) Int. Cl.
*F28F 7/00* (2006.01)
(52) U.S. Cl. ..................... 165/80.3; 165/185
(58) Field of Classification Search ...... 165/80.1–80.3, 165/185
See application file for complete search history.

(56) References Cited

U.S. PATENT DOCUMENTS

| 6,477,051 | B1 | 11/2002 | Barsun |
| 6,538,889 | B1 | 3/2003 | Barsun et al. |
| 6,626,233 | B1 | 9/2003 | Connors |
| 6,659,168 | B1 | 12/2003 | Barsun |
| 6,667,885 | B1 | 12/2003 | Malone et al. |
| 6,918,438 | B1* | 7/2005 | Ellsworth et al. ............ 165/185 |
| 2002/0179285 | A1* | 12/2002 | Sas et al. .................... 165/80.3 |
| 2003/0210525 | A1* | 11/2003 | Chung et al. .............. 165/80.3 |
| 2004/0188063 | A1* | 9/2004 | Chang ........................ 165/80.3 |
| 2005/0167083 | A1* | 8/2005 | Belady et al. ............. 165/80.3 |

* cited by examiner

*Primary Examiner*—Teresa J. Walberg
(74) *Attorney, Agent, or Firm*—Leslie P. Gehman

(57) ABSTRACT

A first heat sink is built including two sets of fins with a gap between the two fin sets. The gap is configured to allow the placement of a second heat sink between the two fin sets of the first heat sink. The first heat sink also includes slotted mounting lugs to allow the second heat sink to be mounted to the first heat sink allowing for varying stack up tolerances of the heat generating devices cooled by the first and second heat sinks.

35 Claims, 8 Drawing Sheets

HEAT SINK

FIELD OF THE INVENTION

The present invention relates generally to the field of heat sinks, and more particularly to the field of high efficiency heat sinks.

BACKGROUND OF THE INVENTION

As modern electronics evolve, they continue to shrink in size, yet increase in power density, and in the amount of heat they generate during operation. In order for these electronic devices to perform properly, their temperature must be strictly controlled within a given temperature range. Often, designers will attach heat sinks to the electronic devices to dissipate this excess heat. Typically heat sinks include fins or pins to increase the surface area of the heat sink within a constrained space and thus correspondingly increase the heat transfer capacity of the heat sink.

Many electronic systems include more than one heat generating device. Often it is desirable to attach heat sinks to multiple heat generating devices on one or more printed circuit boards. However, difficulties arise when a single heat sink is attached to multiple heat generating devices on a common printed circuit board or on multiple printed circuit boards. Many times the heat generating devices are of different thicknesses, or the top surfaces of the heat generating devices are in different planes and may not even be parallel, requiring corresponding topography on the base of the heat sink to allow high quality thermal coupling between the heat sink and the multiple devices. This greatly adds to the expense of the heat sink, and in some cases, may not even be possible if the stack up tolerances of the multiple devices are large enough that the variations in stack up tolerances are too large for whatever gasket (or other heat coupling technology) is used to thermally couple the heat generating devices to a single heat sink, whereas it is relatively easy to thermally couple a single heat generating device to a heat sink.

SUMMARY OF THE INVENTION

A first heat sink is built including two sets of fins with a gap between the two fin sets. The gap is configured to allow the placement of a second heat sink between the two fin sets of the first heat sink. The first heat sink also includes slotted mounting lugs to allow the second heat sink to be mounted to the first heat sink allowing for varying stack up tolerances of the heat generating devices cooled by the first and second heat sinks.

Other aspects and advantages of the present invention will become apparent from the following detailed description, taken in conjunction with the accompanying drawings, illustrating by way of example the principles of the invention.

DETAILED DESCRIPTION

Figure 1:
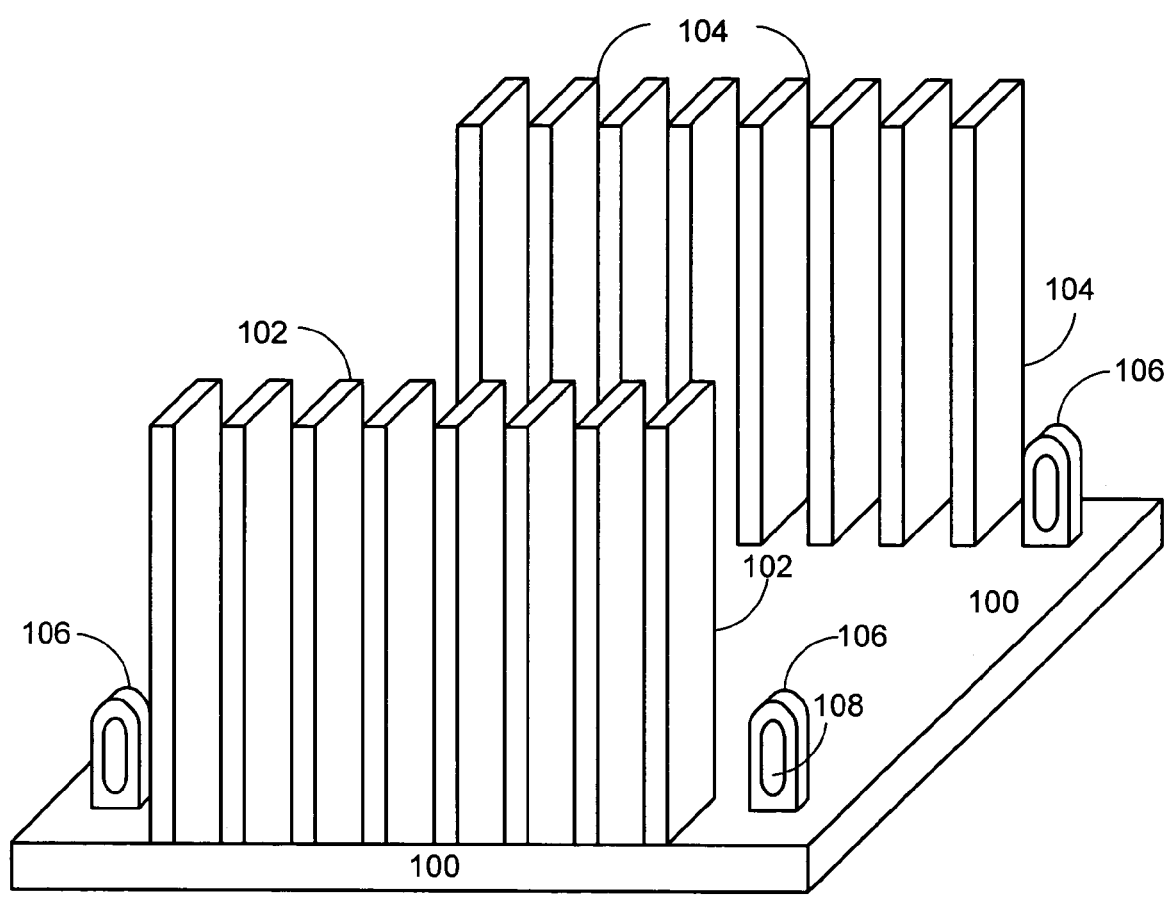
FIG. 1 is a perspective view of an example embodiment of a first heat sink according to the present invention.

This description of the preferred embodiments is intended to be read in connection with the accompanying drawings, which are to be considered part of the entire written description of this invention. In the description, relative terms such as "lower," "upper," "horizontal," "vertical," "up," "down," "top," "bottom," "left," and "right" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms concerning attachments, coupling and the like, such as "connected," "coupled," and "interconnected," refer to a relationship wherein structures are secured or attached to one another either directly or indirectly through intervening structures, as well as both movable or rigid attachments or relationships, unless expressly described otherwise.

FIG. 1 is a perspective view of an example embodiment of a first heat sink according to the present invention. In an example embodiment of the present invention a heat sink is constructed including a base 100 a first set of fins 102, a second set of fins 104, and four mounting lugs 106. There is a gap between the first set of fins 102 and the second set of fins 104 allowing a second heat sink to fit between the two sets of fins of the first heat sink. This assembly of the two heat sinks is shown in FIGS. 4 through 7. Each of the mounting lugs 106 includes a slot 108 allowing mounting hardware to slide along an axis within the slot 108. This allows the attachment of a second heat sink to the first heat sink at a variety of heights above the base 100 of the first heat sink. This offset between the first heat sink and the second heat sink allows the use of these two heat sinks with two or more heat generating devices with a variety of stack up tolerances. For example, the upper surfaces of the heat generating devices may not be coplanar, and this degree of non-co-planarity (stack up tolerance) may vary from device to device even within a single production run. By allowing the second heat sink to move vertically with respect to the first heat sink, devices may be easily assembled with a variety of stack up offsets.

Figure 2:
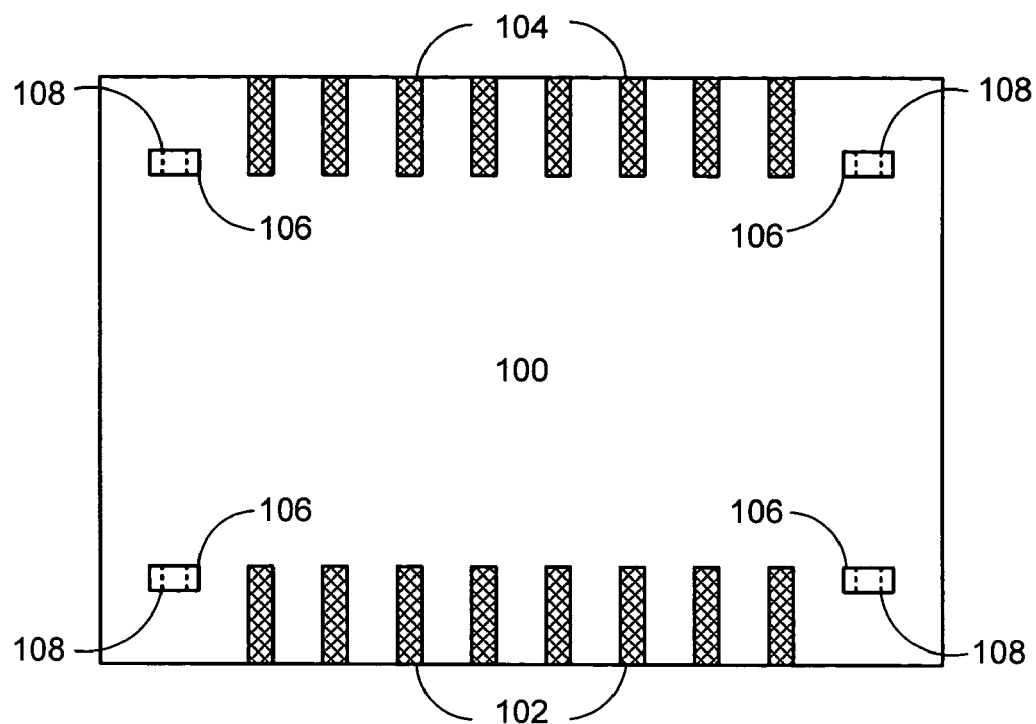
FIG. 2 is a top view of the first heat sink from FIG. 1.

FIG. 2 is a top view of the first heat sink from FIG. 1. The gap between the first set of fins 102 and the second set of fins 104 is clearly shown in this example embodiment of the present invention. The fins are cross-hatched to differentiate them from the base 100 of the heat sink. Also visible in this figure are four mounting lugs 106, each including a slot 108.

While this example embodiment of the present invention uses four mounting lugs 106 in a particular physical configuration, those of skill in the art will recognize that any number of mounting lugs may be used in a wide variety of physical configurations to physically couple the second heat sink to the first heat sink within the scope of the present invention. Those of skill in the art will also recognize that the size and configuration of the gap between the first set of fins 102 and the second set of fins 104 may be variably configured to allow the attachment of a very wide variety of different configurations of second heat sinks within the scope of the present invention. Also, the number, configuration, and type of the sets of fins may vary widely within the scope of the present invention. For example, while solid metal heat sink bodies and fins are shown in FIGS. 1 through 7, many other types of materials and configurations may be used within the scope of the present invention. Some other example embodiments of the present invention may use heat pipes or folded fin structures, all within the scope of the present invention.

Figure 3:
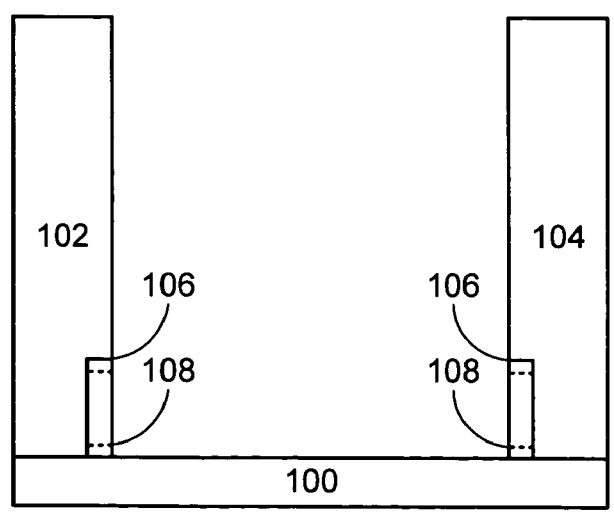
FIG. 3 is a side view of the first heat sink from FIG. 1.

FIG. 3 is a side view of the first heat sink from FIG. 1. This side view of an example embodiment of the present invention illustrates the gap that is formed between the first set of fins 102 and the second set of fins 104. This gap is the location where the second heat sink will reside when it is mechanically coupled to the first heat sink. Also note that two of the mounting lugs 106 are shown in this example embodiment (with the other two hidden behind the sets of fins). These mounting lugs 106 are configured to allow mechanical coupling of the second heat sink to the first heat sink in a variety of positions due to the slots 108 in the mounting lugs 106.

Figure 4:
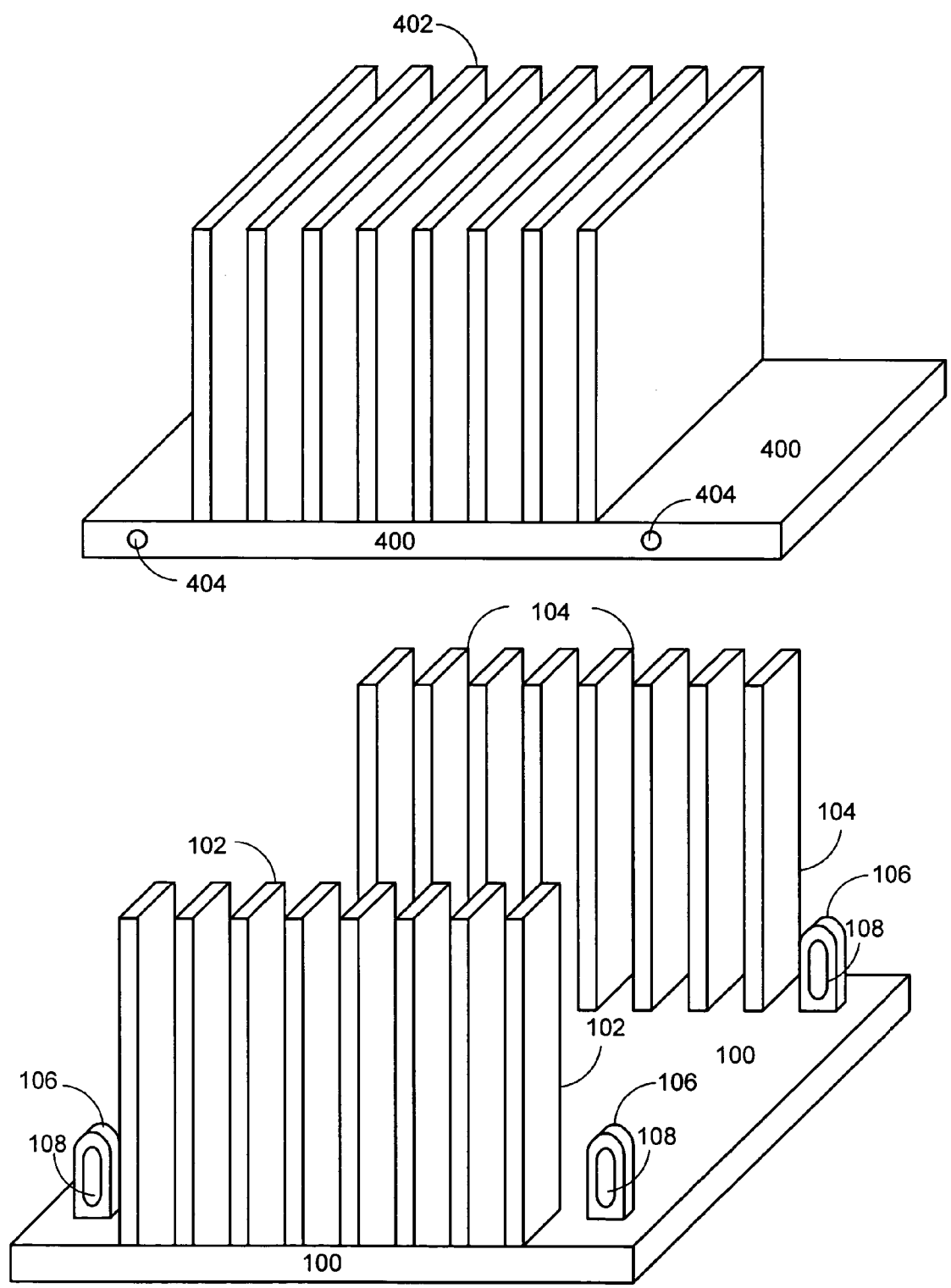
FIG. 4 is a perspective view of an example embodiment of a first and second heat sink according to the present invention prior to mechanical coupling of the second heat sink to the first heat sink.

FIG. 4 is a perspective view of an example embodiment of a first and second heat sink according to the present invention prior to mechanical coupling of the second heat sink to the first heat sink. This figure shows the first heat sink from FIG. 1 along with a second heat sink configured to fit within the gap between the sets of fins of the first heat sink. This second heat sink includes a base 400, a set of fins 402, and four mounting holes 404. These mounting holes 404 may be threaded to accept a bolt or screw mounting the second heat sink to the mounting lugs 106 of the first heat sink. Since the mounting lugs 106 include slots for the bolts (or screws), the second heat sink may be mechanically coupled to the first heat sink at a variety of positions. Those of skill in the art will recognize that many other mechanical coupling means may be used to mechanically couple the second heat sink to the first heat sink in a variety of positions. Mounting lugs 106 and mounting holes 404 configured for bolts or screws are shown in this example embodiment of the present invention, but other mounting means may be used within the scope of the present invention.

Figure 5:
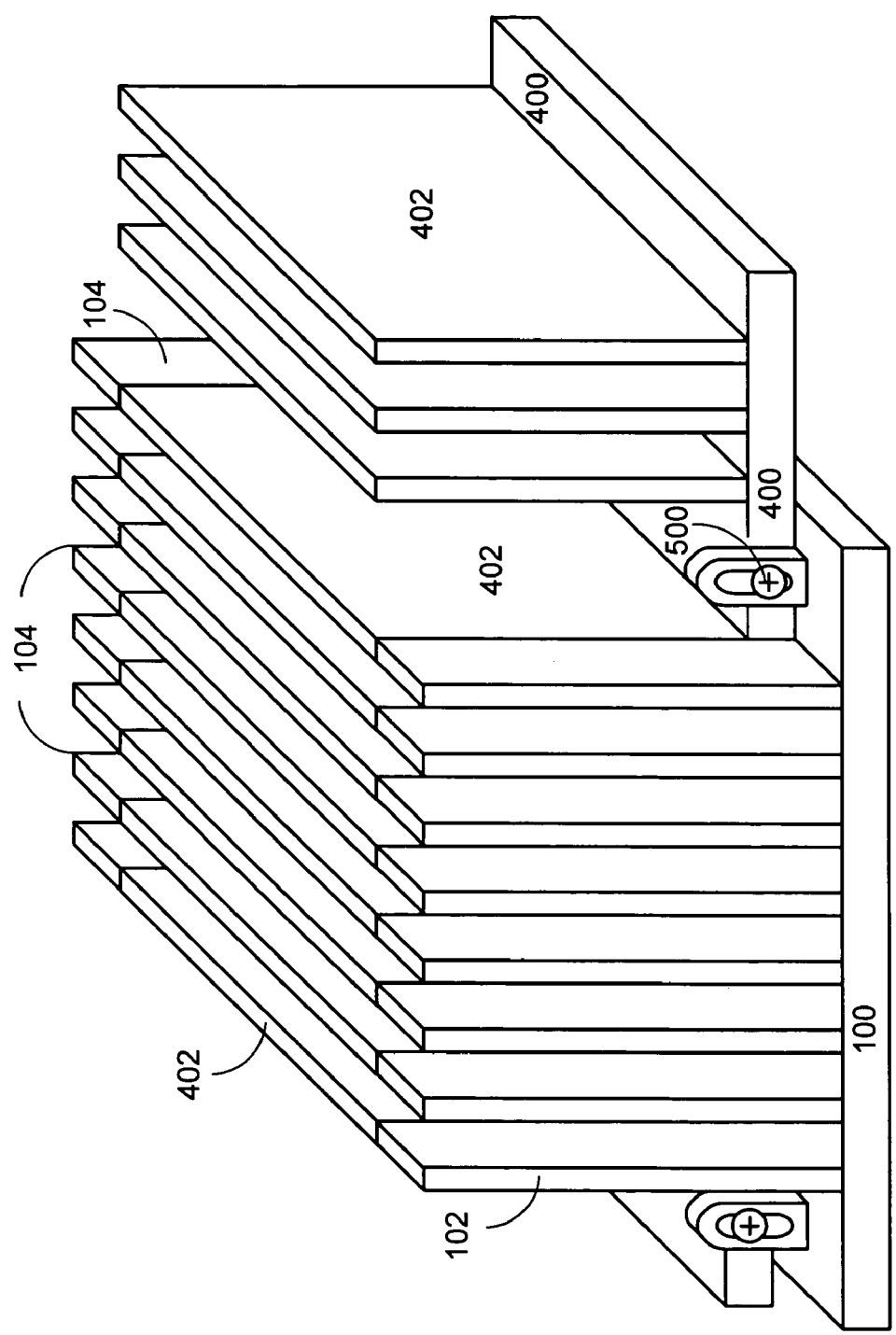
FIG. 5 is a perspective view of an example embodiment of a first and second heat sink according to the present invention following mechanical coupling of the second heat sink to the first heat sink.

FIG. 5 is a perspective view of an example embodiment of a first and second heat sink according to the present invention following mechanical coupling of the second heat sink to the first heat sink. The first heat sink and second heat sink from FIG. 4 are now shown in a mounted position. The second heat sink is mechanically coupled to the first heat sink by bolts 500 passing through the slots 108 in the mounting lugs 106 of the first heat sink into the mounting holes 404 of the second heat sink. While this example embodiment of the present invention includes mounting lugs 106 that are aligned with an edge of the sets of heat sink fins, other configurations of fins and lugs 106 may be used within the scope of the present invention. Note that the fins 402 of the second heat sink are aligned with the first set of fins 102 and the second set of fins 104 of the first heat sink. This reduces disruptions in the air flow across the fins of the first and second heat sinks. Also note that a number of the fins 402 of the second heat sink are attached to the second heat sink base 400 outside of the two sets of fins attached to the first heat sink base 100. In cases where the second heat sink must dissipate more heat than the first heat sink, a substantial number of additional fins 402 may be added to the second heat sink base 400 outside of the extent of the first heat sink. In this example embodiment of the present invention, the heat generating device making use of the second heat sink would be thermally coupled to the bottom of the second heat sink base 400 to the right of the first heat sink base 100. The heat generating device making use of the first heat sink would be thermally coupled to the bottom of the first heat sink base 100. By mechanically coupling the second heat sink to the first heat sink, a single rigid structure results that is adjustable to the locations and orientations of the two (or more) heat generating devices. In FIG. 5, no gap is shown between the mounting lugs 106 on the first heat sink and base 400 of the second heat sink. In a preferred embodiment of the present invention, a gap of about 0.004 inches exists between the mounting lugs 106 and the second heat sink base 400. This small gap allows easy assembly of the two heat sinks, and upon tightening the bolts 500 (or screws) mechanically coupling the two heat sinks, the mounting lugs 106 deflect slightly and clamp to the sides of the base of the second heat sink 400. Those of skill in the art will recognize that this gap may be of any size within the scope of the present invention. The gap in this example embodiment of the present invention is set at 0.004 inches to allow for manufacturing tolerances, however, other embodiments may have different tolerances allowing for smaller or larger gaps, all within the scope of the present invention. Also, while this example embodiment of the present invention shows the second heat sink fins 402 aligning with the first and second sets of first heat sink fins, those of skill in the art will recognize that these fins do not need to be aligned with each other within the scope of the present invention. Other embodiments of the present invention may use non-aligned heat sink fins for any of a variety of design concerns. Those of skill in the art will also recognize that only one set of first heat sink fins is required within the scope of the present invention. The second set of first heat sink fins is optional and may be used in some embodiments of the present invention. As long as the first set of heat sink fins 102 does not entirely cover the first heat sink base 100 and is configured to allow the placement of the second heat sink beside the first set of heat sink fins 102 and over at least a portion of the first heat sink base 100.

Figure 6:
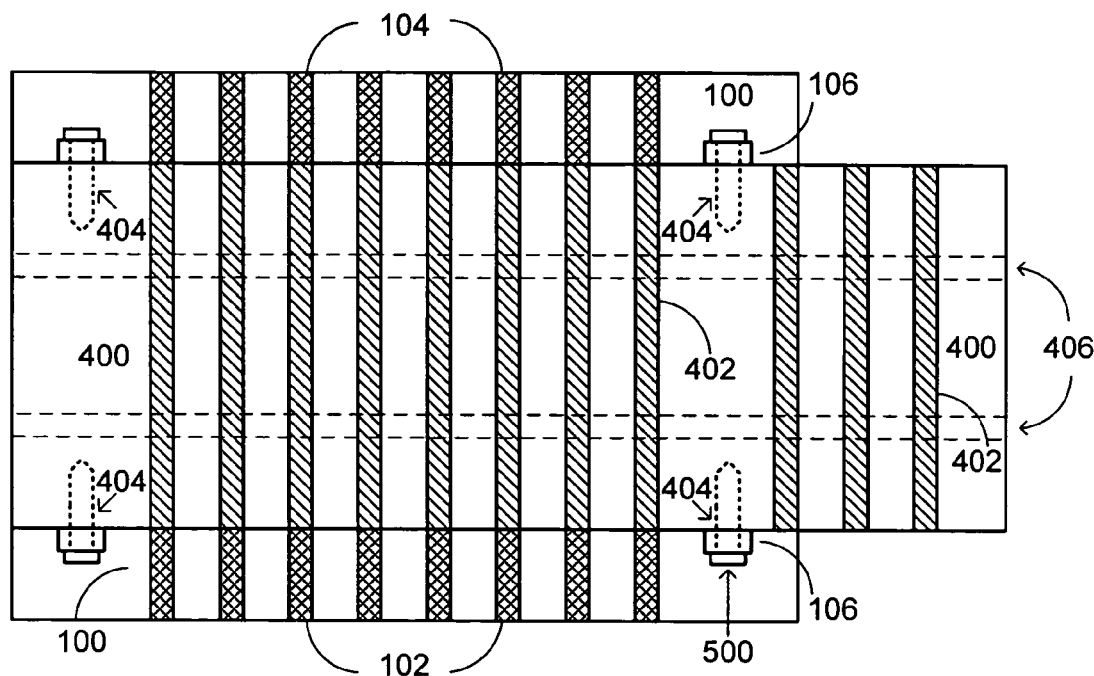
FIG. 6 is a top view of the first and second heat sinks from FIG. 5.

FIG. 6 is a top view of the first and second heat sinks from FIG. 5. This figure shows the attachment of the second heat sink to the first heat sink by bolts 500 passing through the slots 108 in the mounting lugs 106 of the first heat sink into the mounting holes 404 of the second heat sink. Note again that the fins 402 of the second heat sink are aligned with the first set of fins 102 and the second set of fins 104 of the first heat sink. This example embodiment of the present invention also includes two heat pipes 406 within the second heat sink base 400 to help distribute heat from a heat generating device through out the second heat sink. Those of skill in the art will recognize that any number (including zero) of heat pipes may be used within the scope of the present invention.

Figure 7:
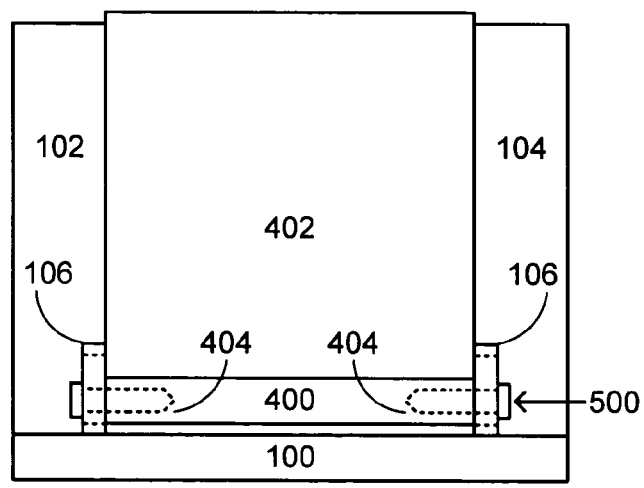
FIG. 7 is a side view of the first and second heat sinks from FIG. 5.

FIG. 7 is a side view of the first and second heat sinks from FIG. 5. In FIG. 5, no gap is shown between the mounting lugs 106 on the first heat sink and base 400 of the second heat sink. In a preferred embodiment of the present invention, a gap of about 0.004 inches exists between the mounting lugs 106 and the second heat sink base 400. This small gap allows easy assembly of the two heat sinks, and upon tightening the bolts 500 (or screws) mechanically coupling the two heat sinks, the mounting lugs 106 deflect slightly and clamp to the sides of the base of the second heat sink 400. Also, a wide variety of attachment means other than the bolts 500 shown in this example embodiment may be used to mechanically couple the second heat sink to the first heat sink within the scope of the present invention. Note also that there is a small gap between the bottom of the second heat sink base 400 and the top of the first heat sink base 100. By designing in this gap, the second heat sink may be adjusted vertically with respect to the first heat sink to match any stack up tolerances and allow for good thermal coupling between the first heat sink and the heat generating device it cools, and between the second heat sink and the heat generating device it cools, while still resulting in a mechanically rigid structure.

Figure 8:
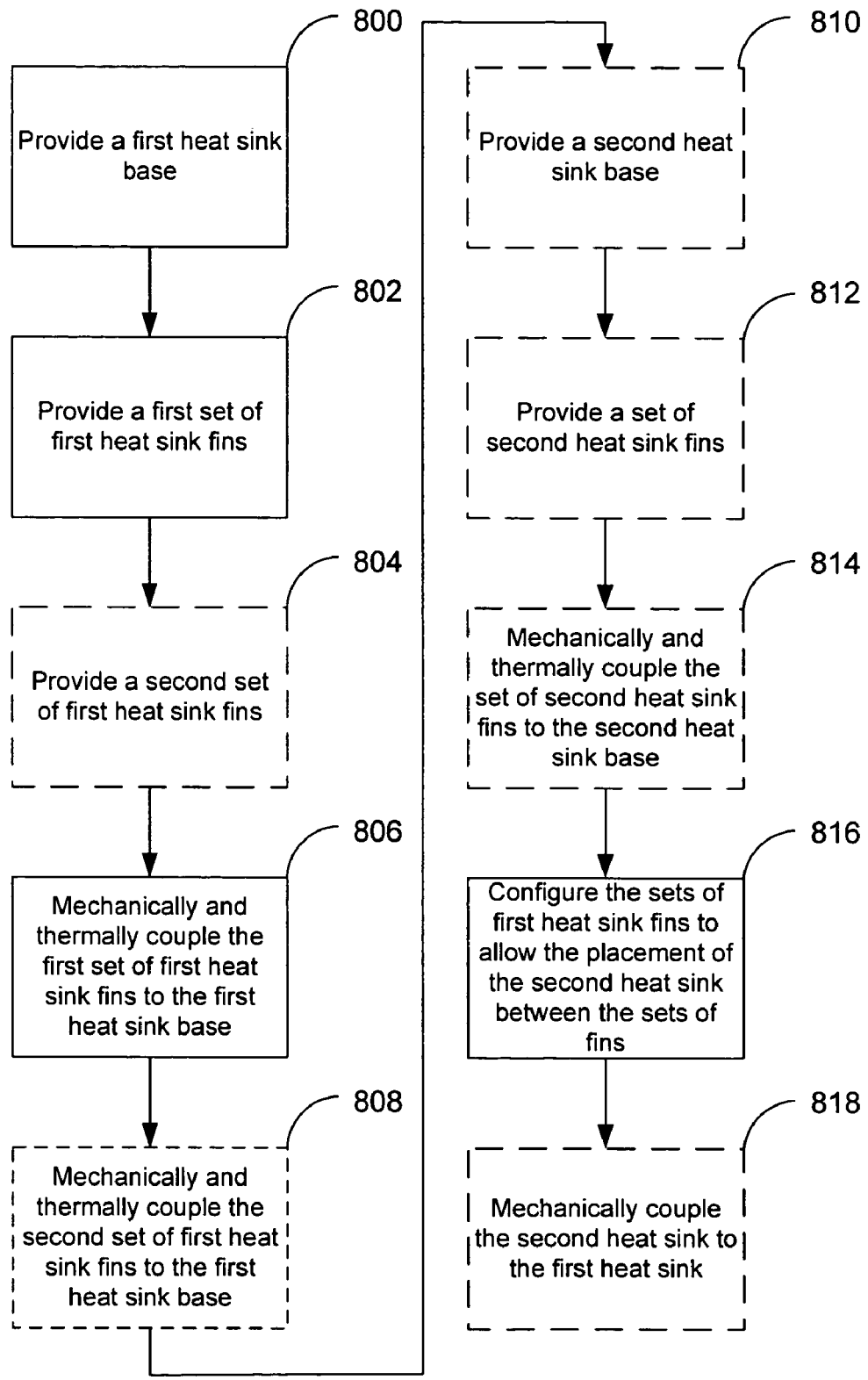
FIG. 8 is a flow chart of a method of constructing a heat sink according to the present invention.

FIG. 8 is a flow chart of a method of constructing a heat sink according to the present invention. Any process descriptions or blocks in the flow chart to follow should be understood as representing modules, segments or portions of code which include one or more executable instructions for implementing specific logical functions or steps in the process, and alternative implementations are included within the scope of the present invention. For example, functions may be executed out of order from that shown or discussed, including substantially concurrently or in reverse order, depending on the functionality involved, as would be understood by those reasonably skilled in the art of the present invention.

In a step 800, a first heat sink body is provided. In a step 802, a first set of first heat sink fins is provided. In an optional step 804, a second set of first heat sink fins is provided. In a step 806, the first set of first heat sink fins is mechanically and thermally coupled to the first heat sink base. In an optional step 808, the second set of first heat sink fins is mechanically and thermally coupled to the first heat sink base. In an optional step 810, a second heat sink base is provided. In an optional step 812, a set of second heat sink fins is provided. In an optional step 814, the set of second heat sink fins is mechanically and thermally coupled to the second heat sink base. In a step 816, the sets of first heat sink fins are configured to allow the placement of the second heat sink between the sets of first heat sink fins. In an optional step 818, the second heat sink is mechanically coupled to the first heat sink.

Figure 9:
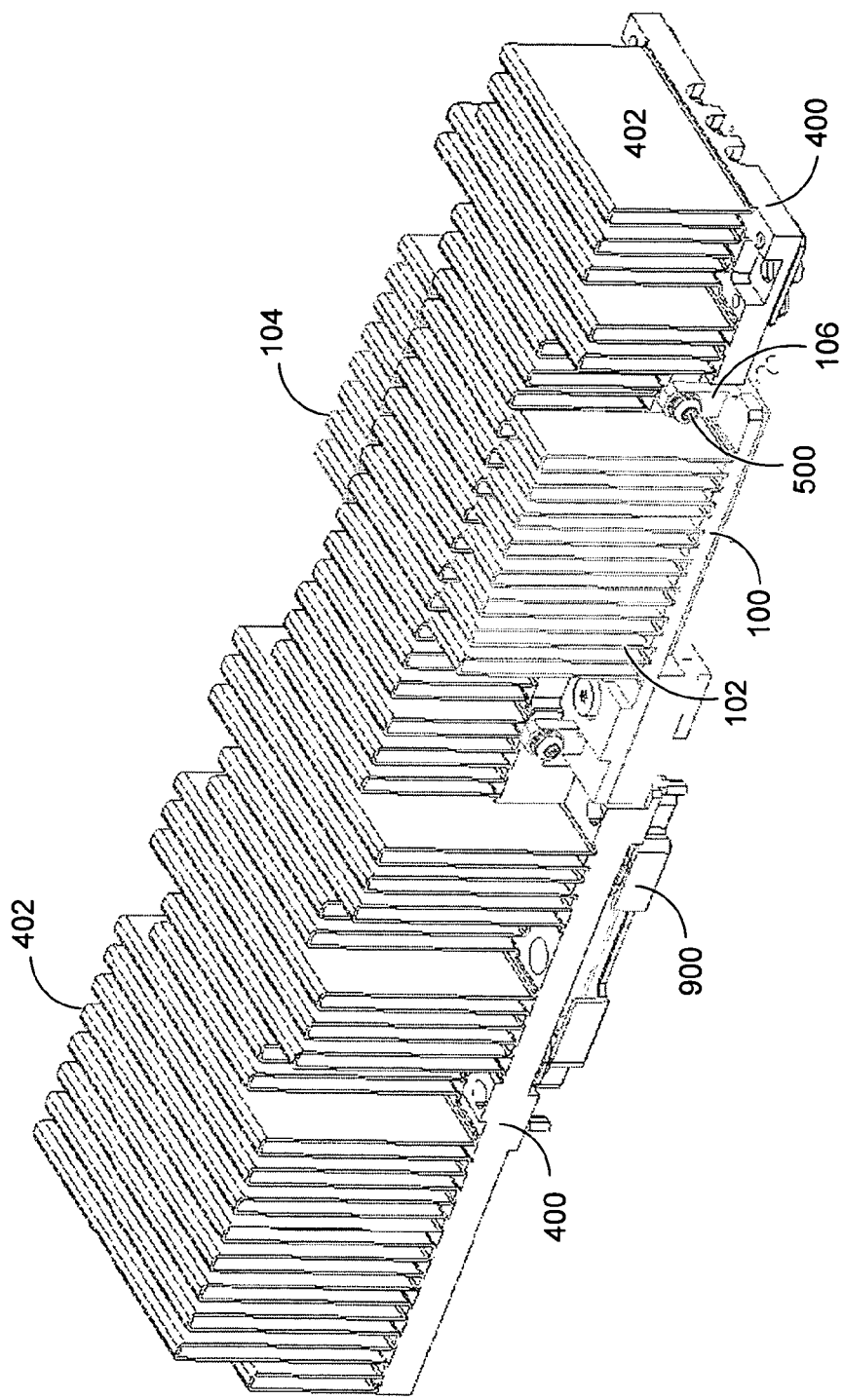
FIG. 9 is a perspective view of an example embodiment of a first and second heat sink according to the present invention following mechanical coupling of the second heat sink to the first heat sink.

FIG. 9 is a perspective view of an example embodiment of a first and second heat sink according to the present invention following mechanical coupling of the second heat sink to the first heat sink. In this example embodiment of the present invention, the second heat sink is much larger than the first heat sink and extends well past the dimensional bounds of the first heat sink. The first heat sink as shown includes a first heat sink base 100, a first set of first heat sink fins 102, a second set of first heat sink fins 104, and a plurality of attachment lugs 106. The second heat sink includes a second heat sink base 400, and second heat sink fins 402. In this example embodiment of the present invention, the second heat sink bass 400 includes a step, resulting in a bi-level heat sink. The stepped portion of the second heat sink in this example embodiment is positioned above the first heat sink base 100. The second heat sink is mechanically coupled to the first heat sink by bolts 500 passing through the mounting lugs 106 and screwing into the second heat sink base 400. Those of skill in the art will recognize that many other schemes of attachment may be used to mechanically couple the second heat sink to the first heat sink within the scope of the present invention. Also, this example embodiment of the present invention shows the positioning of a second heat generating device 900 beneath the second heat sink base 400. Those of skill in the art will recognize that the second heat sink base 400, perhaps including heat pipes, will transport heat from the second heat generating device 900 to all of the second heat sink fins 402 including those above the first heat sink base 100.

Figure 10:
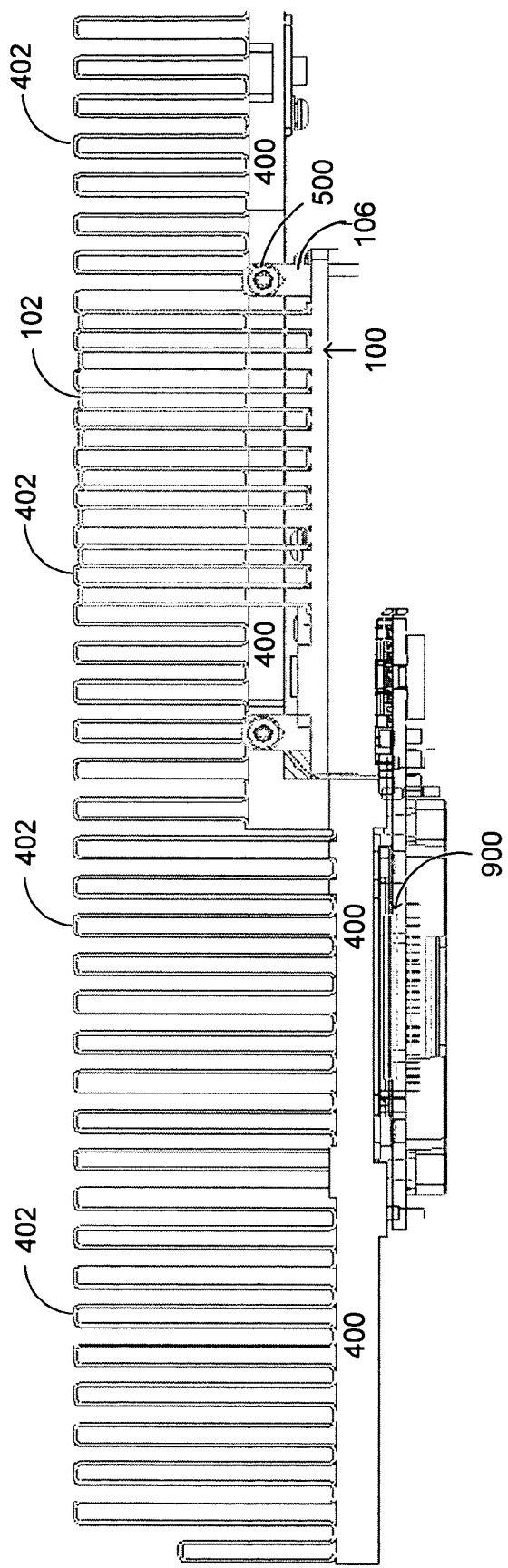
FIG. 10 is a side view of an example embodiment of a first and second heat sink according to the present invention following mechanical coupling of the second heat sink to the first heat sink.

FIG. 10 is a side view of an example embodiment of a first and second heat sink according to the present invention following mechanical coupling of the second heat sink to the first heat sink. FIG. 10 is a side view of the example embodiment of the present invention shown in FIG. 9. As in FIG. 9, the first heat sink as shown includes a first heat sink base 100, a first set of first heat sink fins 102, a second set of first heat sink fins 104, and a plurality of attachment lugs 106. The second heat sink includes a second heat sink base 400, and second heat sink fins 402. In this example embodiment of the present invention, the second heat sink bass 400 includes a step, resulting in a bi-level heat sink. The stepped portion of the second heat sink in this example embodiment is positioned above the first heat sink base 100. The second heat sink is mechanically coupled to the first heat sink by bolts 500 passing through the mounting lugs 106 and screwing into the second heat sink base 400. Those of skill in the art will recognize that many other schemes of attachment may be used to mechanically couple the second heat sink to the first heat sink within the scope of the present invention. Also, this example embodiment of the present invention shows the positioning of a second heat generating device 900 beneath the second heat sink base 400. Those of skill in the art will recognize that the second heat sink base 400, perhaps including heat pipes, will transport heat from the second heat generating device 900 to all of the second heat sink fins 402 including those above the first heat sink base 100. In this example embodiment of the present invention, a folded fin heat sink design is used. However, those of skill in the art will recognize that any other type of heat sink fin may be used within the scope of the present invention. Also, while this example embodiment of the present invention shows the second heat sink fins 402 aligning with the first and second sets of first heat sink fins, those of skill in the art will recognize that these fins do not need to be aligned with each other within the scope of the present invention. Other embodiments of the present invention may use non-aligned heat sink fins for any of a variety of design concerns.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A heat sink comprising:
   a heat sink base:
   a first set of heat sink fins, mechanically and thermally coupled to said heat sink base, and configured to allow the placement of a second heat sink next to said first set of heat sink fins and over at least a portion of said heat sink base;
a second set of heat sink fins, mechanically and thermally coupled to said heat sink base, wherein said first and second sets of heat sink fins are configured to allow the placement of a second heat sink between said first and second sets of heat sink fins; and
a mounting lug mechanically coupled to said hear sink base, and configured to allow mechanical coupling of said heat sink wit a second heat sink.

2. A heat sink as recited in claim 1,
wherein said mounting lug includes a slot configured to allow attachment of a second heat sink to said heat sink in a variety of positions.

3. A heat sink as recited in claim 1,
wherein said heat sink base and said first and second sets of fins are aluminum.

4. A heat sink as recited in claim 1,
wherein said heat sink base and said first and second sets of fins are copper.

5. A sink as recited in claim 1,
wherein said heat sink base and said first and second sets of fins are graphite.

6. A heat sink as recited in claim 1,
wherein said first and second sets of fins are folded fins.

7. A device comprising:
a first heat sink, comprising:
 a first heat sink base; and
 a first set of first heat sink fins, mechanically and thermally coupled to said first heat sink base; and
a second heat sink, comprising:
 a second heat sink base; and
 a set of second heat sink fins, mechanically and thermally coupled to said second heat sink base; and
wherein said first set of first heat sink fins are configured to allow the placement of said second heat sink next to said first set of heat sink fins and over at least a portion of said first heat sink base;
wherein said first and second sets of first heat sink fins are configured to allow the placement of said second heat sink between said first and second sets of first heat sink fins; and
wherein said first heat sink, further comprises:
 a second set of first heat sink fins, mechanically and thermally coupled to said first heat sink base; and
 a mounting lug mechanically coupled to said first heat sink base, and configured to allow mechanical coupling of said first heat sink with a second heat sink.

8. A device as recited in claim 7,
wherein said mounting lug includes a slot configured to allow attachment of a second heat sink to said first heat sink in a variety of positions.

9. A device as recited in claim 8,
wherein said second heat sink base includes a mounting hole, configured to allow mechanical coupling of said second heat sink with said first heat sink through said mounting lug.

10. A device as recited in claim 9,
wherein said second heat sink is mechanically coupled to said first heat sink by a bolt through said mounting lug into said mounting hole.

11. A device as recited in claim 9,
wherein said second heat sink is mechanically coupled to said first heat sink by a screw through said mounting lug into said mounting hole.

12. A heat sink as recited in claim 7,
wherein said first heat sink base and said first and second sets of first heat sink fins are aluminum.

13. A heat sink as recited in claim 7,
wherein said first heat sink base and said first and second sets of first heat sink fins are copper.

14. A heat sink as recited in claim 7,
wherein said first heat sink base and said first and second sets of first heat sink fins are graphite.

15. A heat sink as recited in claim 7,
wherein said first and second sets of first heat sink fins are folded fins.

16. A heat sink as recited in claim 7,
wherein said second heat sink base and set of second heat sink fins are aluminum.

17. A heat sink as recited in claim 7,
wherein said second heat sink base and set of second heat sink fins are copper.

18. A heat sink as recited in claim 7,
wherein said second heat sink base and set of second heat sink fins are graphite.

19. A heat sink as recited in claim 7,
wherein said set of second heat sink fins are folded fins.

20. A method for constructing a heat sink comprising the steps of:
a) providing a heat sink base;
b) providing a first set of heat sink fins;
c) mechanically and thermally coupling the first set of heat sink fins to the heat sink base;
d) configuring the first set of heat sink fins to allow the placement of a second heat sink next to said first set of heat sink fins and over at least a portion of said heat sink base;
e) providing a second set of heat sink fins;
f) mechanically and thermally coupling the second set of heat sink fins to the heat sink base;
g) configuring the first and second set of heat sink fins to allow the placement of a second heat sink between the first and second sets of heat sink fins;
h) providing a mounting lug;
i) mechanically coupling the mounting lug to the heat sink base; and
j) configuring the mounting lug to allow mechanical coupling of the heat sink with a second heat sink.

21. A method for constructing a heat sink as recited in claim 20, further comprising the step of:
k) creating a slot in the mounting lug, configured to allow attachment of a second heat sink to the heat sink in a variety of positions.

22. A method for constructing a heat sink as recited in claim 20,
wherein said heat sink base and said first and second sets of heat sink fins are aluminum.

23. A method for constructing a heat sink as recited in claim 20,
wherein said heat sink base and said first and second sets of heat sink fins are copper.

24. A method for constructing a heat sink as recited in claim 20,
wherein said heat sink base and said first and second sets of heat sink fins are graphite.

25. A method for constructing a heat sink as recited in claim 20,
wherein said first and second sets of heat sink fins are folded fins.

26. A method for constructing a device comprising the steps of:
  a) providing a first heat sink base;
  b) providing a first set of first heat sink fins;
  c) mechanically and thermally coupling the first set of first heat sink fins to the first heat sink base;
  d) providing a second heat sink base;
  e) providing a set of second heat sink fins;
  f) mechanically and thermally coupling the set of second heat sink fins to the second heat sink base, creating a second heat sink;
  g) configuring the first set of first heat sink fins to allow the placement of the second heat sink next to said first set of heat sink fins and over at least a portion of said first heat sink base;
  h) mechanically coupling the second heat sink to the first heat sink;
  i) providing a second set of first heat sink fins;
  j) mechanically and thermally coupling the second set of first heat sink fins to the first heat sink base, creating a first heat sink;
  k) configuring the first and second set of first heat sink fins to allow the placement of to second heat sink between the first and second sets of first heat sink fins;
  l) providing a mounting lug;
  m) mechanically coupling the mounting lug to the first heat sink base; and
  n) configuring the mounting lug to allow mechanical coupling of the first heat sink with the second heat sink.

27. A method for constructing a heat sink as recited in claim 26, further comprising the step of:
  o) creating a slot in the mounting lug, configured to allow attachment of the second heat sink to the first heat sink in a variety of positions.

28. A method for constructing a heat sink as recited in claim 26,
  wherein said first heat sink base and said first and second sets of first heat sink fins are aluminum.

29. A method for constructing a heat sink as recited in claim 26,
  wherein said first heat sink base and said first and second sets of first heat sink fins are copper.

30. A method for constructing a heat sink as recited in claim 26,
  wherein said first heat sink base and said first and second sets of first heat sink fins are graphite.

31. A method for constructing a heat sink as recited in claim 26,
  wherein said first and second sets of first heat sink fins are folded fins.

32. A method for constructing a heat sink as recited in claim 26,
  wherein said second heat sink base and said set of second heat sink fins are aluminum.

33. A method for constructing a heat sink as recited in claim 26,
  wherein said second heat sink base and said set of second heat sink fins are copper.

34. A method for constructing a heat sink as recited in claim 26,
  wherein said second heat sink base and said set of second heat sink fins are graphite.

35. A method for constructing a heat sink as recited in claim 26,
  wherein said set of second heat sink fins are folded fins.

* * * * *

UNITED STATES PATENT AND TRADEMARK OFFICE
CERTIFICATE OF CORRECTION

PATENT NO.         : 7,117,929 B2
APPLICATION NO.    : 10/976033
DATED              : October 10, 2006
INVENTOR(S)        : Robert Curtis et al.

It is certified that error appears in the above-identified patent and that said Letters Patent is hereby corrected as shown below:

On the face page, in field (73), in "Assignee", in Column 1, line 2, delete "LP.," and insert -- L.P., --, therefor.

In column 6, line 65, in Claim 1, delete "base:" and insert -- base; --, therefor.

In column 7, line 9, in Claim 1, delete "hear" and insert -- heat --, therefor.

In column 7, line 11, in Claim 1, delete "wit" and insert -- with --, therefor.

In column 7, line 22, in Claim 5, after "A" insert -- heat --.

In column 9, line 23, in Claim 26, after "of" delete "to" and insert -- the --, therefor.

Signed and Sealed this

Thirtieth Day of June, 2009

JOHN DOLL
*Acting Director of the United States Patent and Trademark Office*